United States Patent
Sato

(10) Patent No.: US 11,130,311 B2
(45) Date of Patent: Sep. 28, 2021

(54) VAPOR DEPOSITION FILM, BLACK METALLIC PRODUCT, VEHICLE INTERIOR/EXTERIOR MEMBER, CONTAINER, AND CASING

(71) Applicant: OIKE & CO., LTD., Kyoto (JP)

(72) Inventor: Teiko Sato, Kyoto (JP)

(73) Assignee: OIKE & CO., LTD., Kyoto (JP)

( * ) Notice: Subject to any disclaimer, the term of this patent is extended or adjusted under 35 U.S.C. 154(b) by 27 days.

(21) Appl. No.: 16/687,116

(22) Filed: Nov. 18, 2019

(65) Prior Publication Data

US 2020/0230919 A1 Jul. 23, 2020

(30) Foreign Application Priority Data

Jan. 21, 2019 (JP) .............................. JP2019-008039

(51) Int. Cl.
*B32B 15/08* (2006.01)
*B32B 27/20* (2006.01)
*C23C 16/06* (2006.01)

(52) U.S. Cl.
CPC .............. *B32B 15/08* (2013.01); *B32B 27/20* (2013.01); *C23C 16/06* (2013.01); *B32B 2307/4026* (2013.01); *B32B 2311/16* (2013.01); *B32B 2311/30* (2013.01); *B32B 2313/04* (2013.01); *B32B 2451/00* (2013.01); *B32B 2605/00* (2013.01)

(58) Field of Classification Search
CPC . B32B 15/08; B32B 27/20; B32B 2307/4026; B32B 2311/16; B32B 2311/30; B32B 2313/04; B32B 2451/00; B32B 2605/00; C23C 16/06; C23C 28/30; C23C 28/32; C23C 28/321; C23C 28/34; C23C 28/343; C23C 28/00
See application file for complete search history.

(56) References Cited

U.S. PATENT DOCUMENTS

| | | | | | |
|---|---|---|---|---|---|
| 5,164,007 | A | * | 11/1992 | Buxbaum | C01G 49/0072 106/456 |
| 2006/0141253 | A1 | * | 6/2006 | Sugano | C08J 3/12 428/402 |
| 2006/0240246 | A1 | * | 10/2006 | Fukuda | B32B 7/12 428/328 |
| 2014/0141236 | A1 | * | 5/2014 | Magdassi | C09D 7/61 428/332 |
| 2017/0348953 | A1 | * | 12/2017 | Takamatsu | B32B 27/365 |

FOREIGN PATENT DOCUMENTS

| | | | |
|---|---|---|---|
| JP | 2013199028 A | * | 10/2013 |
| JP | 2014208432 | | 11/2014 |
| JP | 2014208432 A | * | 11/2014 |
| WO | 2012/145283 | | 10/2012 |
| WO | 2016/106207 | | 6/2016 |
| WO | 2019/003219 | | 1/2019 |

* cited by examiner

*Primary Examiner* — Daniel J. Schleis
*Assistant Examiner* — Kevin C T Li
(74) *Attorney, Agent, or Firm* — Leason Ellis LLP

(57) ABSTRACT

Provided are a vapor deposition film, a black metallic product, a vehicle interior/exterior member, a container, and a casing, which are capable of expressing a jet black metallic design having a luxurious appearance on items of various dimensions by a method simpler than a case of applying black plating and are excellent in physical properties such as light resistance. The vapor deposition film comprises: a protection layer; a decoration layer; and a vapor deposition layer, wherein the vapor deposition layer includes a metal including at least any one of indium and tin, wherein the decoration layer includes a resin and a black pigment, and wherein the black pigment includes carbon black and manganese ferrite having a spinel structure $((Fe,Mn)(Fe,Mn)_2O_4)$.

14 Claims, No Drawings

VAPOR DEPOSITION FILM, BLACK METALLIC PRODUCT, VEHICLE INTERIOR/EXTERIOR MEMBER, CONTAINER, AND CASING

CROSS-REFERENCE TO PRIOR APPLICATION

This application claims priority to and the benefit thereof from Japanese Patent Application No. 2019-008039, filed Jan. 21, 2019, titled "VAPOR DEPOSITION FILM, BLACK METALLIC PRODUCT, VEHICLE INTERIOR/EXTERIOR MEMBER, CONTAINER, AND CASING," the entirety of which is hereby incorporated herein by reference.

TECHNICAL FIELD

The present invention relates to a vapor deposition film, a black metallic product, a vehicle interior/exterior member, a container, and a casing. More specifically, the present invention relates to a vapor deposition film, a black metallic product, a vehicle interior/exterior member, a container, and a casing, which are capable of expressing a jet black metallic design having a luxurious appearance on items of various dimensions by a method simpler than a case of applying black plating and are excellent in physical properties such as light resistance.

BACKGROUND OF THE INVENTION

Hitherto, for example, in fields of a vehicle interior/exterior member, a container, and a casing, a black metallic design has been desired for a luxurious appearance. As a method of giving such a black metallic design to an item, there has been known a method of applying, for example, black plating. Through the black plating, a base material surface of an item having a base material subjected to, for example, anodic oxidation, coating, and chemical treatment is blackened.

However, steps of the black plating are complicated. Moreover, unevenness and flaws are easily noticed on an item having been subjected to the black plating, and an advanced technique is required for prevention of the unevenness and flaws. Moreover, the black plating is generally reddish, and hence a sufficient jet black tone cannot be obtained. Further, the black plating has a small adjustable range of a color tone. In addition, the black plating has a high environmental load. Therefore, the black plating is not suitable for processing of a large part, and is liable to cause increase in cost with regard to processing of a small part.

Incidentally, there has been known a decorative molded article for decorating items such as a vehicle interior/exterior member, a container, or a casing through use of a vapor deposition film. Therefore, there has been developed a technique for expressing a black metallic design through use of such vapor deposition film (Japanese Patent Application Publication No. 2014-208432). In Japanese Patent Application Publication No. 2014-208432, there is disclosed a decorative sheet having the following configuration. Specifically, the decorative sheet is formed of a laminate including at least a base material layer, a primer layer, and a metal thin film layer laminated in the stated order, and the primer layer includes a cured material of a resin having a glass transition point of from −30° C. to 80° C. The primer layer may include a pigment such as carbon black.

SUMMARY OF THE INVENTION

However, in general, when a black metallic design is to be expressed through use of a vapor deposition film, a color tone to be obtained is liable to be a brownish color tone. Moreover, in order to make a measure for improvement with regard to such brownish color tone, when another colorant (for example, a blue pigment) is blended as a complementary color, it is required that, for example, the blue pigment be dispersed in a resin layer on a top side of a vapor deposition surface. Therefore, the vapor deposition film is influenced by both a light beam from the top side and reflected light from the vapor deposition surface, and is liable to be degraded in light resistance. Further, through the blending of another colorant, a vapor deposition layer is liable to be degraded in adhesion between a protection layer and the vapor deposition layer. Therefore, it is required that an additional resin layer be provided, with the result that the vapor deposition film is liable to be increased in the number of layers in its layer configuration. As a result, an interface is formed between layers in the vapor deposition film, and hence the color tone is consequently influenced, and the black metallic design having a luxurious appearance cannot be obtained.

The present invention has been made in view of the related-art invention, and has an object to provide a vapor deposition film, a black metallic product, a vehicle interior/exterior member, a container, and a casing, which are capable of expressing a jet black metallic design having a luxurious appearance on items of various dimensions by a method simpler than a case of applying black plating and are excellent in physical properties such as light resistance.

As a result of extensive studies, the inventor of the present invention found that the problem described above can be favorably solved through employment of a vapor deposition layer including a predetermined metal and a decoration layer including a predetermined black pigment, and completed the present invention. That is, a vapor deposition film, a black metallic product, a vehicle interior/exterior member, a container, and a casing according to the present invention for solving the problem described above mainly have the following configuration.

(1) A vapor deposition film, comprising: a protection layer; a decoration layer; and a vapor deposition layer, wherein the vapor deposition layer includes a metal including at least any one of indium and tin, wherein the decoration layer includes a resin and a black pigment, and wherein the black pigment includes carbon black and manganese ferrite having a spinel structure ($(Fe,Mn)(Fe,Mn)_2O_4$).

With such configuration, the vapor deposition film is capable of expressing a jet black metallic design on items of various dimensions by a method simpler than a case of applying black plating and is excellent in physical properties such as light resistance.

(2) The vapor deposition film according to (1), wherein the protection layer, the decoration layer, and the vapor deposition layer are directly laminated in the stated order.

With such configuration, an additional layer (for example, an anchor layer) for improving adhesion between the protection layer and the vapor deposition layer is not required. That is, in the vapor deposition film, the decoration layer serves also as an anchor layer, and the protection layer and the vapor deposition layer are excellent in adhesion therebetween. Moreover, the vapor deposition film has less interfaces each formed between layers. Therefore, the vapor deposition film is excellent in color tone.

(3) The vapor deposition film according to (1) or (2), wherein a content of the manganese ferrite among components forming the decoration layer in terms of a solid content is from 2.0 mass % to 15.0 mass %.

With such configuration, the vapor deposition film is capable of further expressing the jet black metallic design.

(4) The vapor deposition film according to any one of (1) to (3), wherein a content of the carbon black among components forming the decoration layer in terms of a solid content is from 0.5 mass % to 8.0 mass %.

With such configuration, the vapor deposition film is capable of further expressing the jet black metallic design.

(5) The vapor deposition film according to (4), wherein a content of the manganese ferrite among components forming the decoration layer in terms of a solid content is from 4.0 mass % to 7.0 mass %.

With such configuration, the vapor deposition film is capable of further expressing the jet black metallic design as compared to the case of applying the black plating.

(6) The vapor deposition film according to any one of (1) to (5), wherein an average particle diameter of the manganese ferrite is from 100 nm to 500 nm, and an average particle diameter of the carbon black is from 100 nm to 500 nm.

With such configuration, the vapor deposition film is excellent in transparency and is more excellent in physical properties such as light resistance.

(7) A black metallic product using the vapor deposition film of any one of (1) to (6).

With such configuration, various products which are capable of expressing the jet black metallic design having a luxurious appearance by a method simpler than the case of applying the black plating and are excellent in physical properties such as light resistance can be obtained.

(8) A vehicle interior/exterior member using the vapor deposition film of any one of (1) to (6).

With such configuration, various vehicle interior/exterior members which are capable of expressing the jet black metallic design having a luxurious appearance by a method simpler than the case of applying the black plating and are excellent in physical properties such as light resistance can be obtained.

(9) A container using the vapor deposition film of any one of (1) to (6).

With such configuration, with regard to containers such as containers for cosmetics for which an outer appearance having a glossy or luxurious appearance is desired, various containers which are capable of expressing the jet black metallic design having a luxurious appearance by a method simpler than the case of applying the black plating and are excellent in physical properties such as light resistance can be obtained.

(10) A casing using the vapor deposition film of any one of (1) to (6).

With such configuration, with regard to casings such as casings for communication devices including mobile phones for which an outer appearance having a luxurious appearance is desired, various casings which are capable of expressing the jet black metallic design having a luxurious appearance by a method simpler than the case of applying the black plating and are excellent in physical properties such as light resistance can be obtained.

According to the present invention, there can be provided a vapor deposition film, a black metallic product, a vehicle interior/exterior member, a container, and a casing, which are capable of expressing a jet black metallic design having a luxurious appearance on items of various dimensions by a method simpler than a case of applying black plating and are excellent in physical properties such as light resistance.

DETAILED DESCRIPTION

<Vapor Deposition Film>

A vapor deposition film according to one embodiment of the present invention includes a protection layer, a decoration layer, and a vapor deposition layer. The vapor deposition layer includes a metal including at least any one of indium and tin. The decoration layer includes a resin and a black pigment. The black pigment includes carbon black and manganese ferrite having a spinel structure ((Fe,Mn)(Fe,Mn)$_2$O$_4$). Now, description is made of respective configurations.

(Protection Layer)

The protection layer is not particularly limited. For example, the protection layer is made of a poly(meth)acrylic ester such as polymethyl methacrylate (PMMA), polycarbonate, polyethylene terephthalate, polyethylene-2,6-naphthalate, polyvinyl fluoride (PVF), polyvinylidene fluoride (PVDF), polytetrafluoroethylene (PTFE), polychlorotrifluoroethylene (PCTFE), an ethylene-tetrafluoroethylene copolymer (ETFE), an ethylene-chlorotrifluoroethylene copolymer (ECTFE), a tetrafluoroethylene-perfluoroalkyl vinyl ether copolymer (PFA), or a tetrafluoroethylene-hexafluoropropylene copolymer (FEP).

A thickness of the protection layer is not particularly limited. For example, it is preferred that the thickness of the protection layer be equal to or larger than 1.0 µm and equal to or smaller than 300 µm. When the thickness of the protection layer falls within the range described above, the vapor deposition film is excellent in scratch resistance and wear resistance.

(Decoration Layer)

The decoration layer is a layer decorated in black, and includes a resin and a black pigment. The black pigment includes carbon black and manganese ferrite having a spinel structure ((Fe,Mn)(Fe,Mn)$_2$O$_4$). The decoration layer includes the carbon black and the manganese ferrite having the spinel structure, and hence it has a jet black metallic design. The spinel structure is one of representative crystal structure types as can be seen in a compound of complex oxide of AB$_2$O$_4$ type (A and B are metal elements). In this embodiment, manganese ferrite formed of a complex oxide of Fe and Mn having the spinel structure is used.

Resin

The resin forming the decoration layer is not particularly limited. Examples of the resin include acrylic resins, urethane resins, urethane-modified polyester resins, polyester resins, epoxy resins, ethylene-vinyl acetate copolymer resins (EVA), vinyl resins (vinyl chloride, vinyl acetate or vinyl chloride-vinylacetate copolymer resin), styrene-ethylene-butylene copolymer resins, polyvinyl alcohol resins, polyacrylamide resins, isobutylene rubber, isoprene rubber, natural rubber, SBR, NBR, and silicone rubber. Those resins may be used in a state of being dissolved in a solvent or in a solventless state, as appropriate.

A content of the resin is not particularly limited. For example, it is preferred that the content of the resin among components forming the decoration layer be equal to or larger than 80 mass %, more preferably equal to or larger than 90 mass %. When the content of the resin falls within the range described above, adhesion between the vapor deposition layer and the protection layer is excellent, and metal luster is not impaired.

Carbon Black

The carbon black is not particularly limited. For example, the carbon black may be general-purpose carbon black. The carbon black may be the one produced by an oil-furnace method. Moreover, carbon black having different colloidal characteristics may be used in combination.

A content of the carbon black is not particularly limited. For example, it is preferred that the content of the carbon black among components forming the decoration layer in terms of a solid content be equal to or larger than 0.5 mass %, more preferably equal to or larger than 1.0 mass %. Moreover, it is preferred that the content of the carbon black among the components forming the decoration layer in terms of a solid content be equal to or smaller than 8.0 mass %, more preferably equal to or smaller than 4.0 mass %. When the content of the carbon black falls within the range described above, the vapor deposition film is capable of further expressing the jet black metallic design.

An average particle diameter of the carbon black is not particularly limited. For example, it is preferred that the average particle diameter of the carbon black be equal to or larger than 100 nm, more preferably equal to or larger than 150 nm. Moreover, it is preferred that the average particle diameter of the carbon black be equal to or smaller than 500 nm, more preferably equal to or smaller than 300 nm. When the average particle diameter of the carbon black falls within the range described above, the vapor deposition film is excellent in transparency and is more excellent in physical properties such as light resistance. The average particle diameter can be measured through use of a dynamic light scattering particle size distribution analyzer (LMS-2000, manufactured by SEISHIN ENTERPRISE Co., Ltd.) under conditions stipulated by JIS Z 8826 (2013).

Manganese Ferrite Having Spinel Structure ($(Fe,Mn)(Fe,Mn)_2O_4$)

The manganese ferrite having the spinel structure is also called "C.I.Pigment Black 26" or "complex oxide black". Moreover, in this embodiment, the description of $(Fe,Mn)(Fe,Mn)_2O_4$ indicates a structure in which the spinel structure has iron or manganese located at its tetrahedral site and iron or manganese located at its octahedral site.

A content of the manganese ferrite having the spinel structure is not particularly limited. For example, it is preferred that the content of the manganese ferrite among components forming the decoration layer in terms of a solid content be equal to or larger than 2.0 mass %, more preferably equal to or larger than 4.0 mass %. Moreover, it is preferred that the content of the manganese ferrite among components forming the decoration layer in terms of a solid content be equal to or smaller than 15.0 mass %, more preferably equal to or smaller than 10.0 mass %. When the content of the manganese ferrite falls within the range described above, the vapor deposition film is capable of further expressing the jet black metallic design.

In the vapor deposition film according to this embodiment, it is preferred that, when the content of the carbon black among components forming the decoration layer in terms of a solid content is from 0.5 mass % to 8.0 mass %, the content of the manganese ferrite having the spinel structure among components forming the decoration layer in terms of a solid content be equal to or larger than 4.0 mass %, more preferably equal to or larger than 6.0 mass %. Moreover, it is preferred that, when the content of the carbon black among components forming the decoration layer in terms of a solid content is from 0.5 mass % to 8.0 mass %, the content of the manganese ferrite having the spinel structure among components forming the decoration layer in terms of a solid content be equal to or smaller than 7.0 mass %. When the contents of the carbon black and the manganese ferrite fall within the respective ranges described above, the vapor deposition film is capable of further expressing the jet black metallic design as compared to the case of applying the black plating.

An average particle diameter of the manganese ferrite having the spinel structure is not particularly limited. For example, it is preferred that the average particle diameter of the manganese ferrite having the spinel structure be equal to or larger than 100 nm, more preferably equal to or larger than 150 nm. Moreover, it is preferred that the average particle diameter of the manganese ferrite having the spinel structure be equal to or smaller than 500 nm, more preferably equal to or smaller than 300 nm. When the average particle diameter of the manganese ferrite having the spinel structure falls within the range described above, the vapor deposition film is excellent in transparency and is more excellent in physical properties such as light resistance. The average particle diameter can be measured through use of a dynamic light scattering particle size distribution analyzer (LMS-2000, manufactured by SEISHIN ENTERPRISE Co., Ltd.) under conditions stipulated by JIS Z 8826 (2013).

(Vapor Deposition Layer)

The vapor deposition layer includes a metal including at least any one of indium and tin. The indium and tin may each be included in a form of oxide or nitride. When the vapor deposition layer includes at least any one of indium and tin, the vapor deposition film to be obtained can easily be produced with the jet black metallic design having a luxurious appearance.

Moreover, the vapor deposition layer may also include various non-metals, metals, metal oxides, and metal nitrides other than indium and tin. The non-metals and metals are not particularly limited. Examples of the non-metals include amorphous carbon (DLC) and a composite thereof. Examples of the metals include metals such as silicon, titanium, zinc, aluminum, and magnesium, oxides thereof, and nitrides thereof.

A content of the metal including at least any one of indium and tin in the vapor deposition layer is not particularly limited.

A thickness of the vapor deposition layer is not particularly limited. For example, it is preferred that the thickness of the vapor deposition layer be equal to or larger than 200 Å, more preferably equal to or larger than 300 Å. Moreover, it is preferred that the thickness of the vapor deposition layer be equal to or smaller than 800 Å, more preferably equal to or smaller than 600 Å. When the thickness of the vapor deposition layer falls within the range described above, the vapor deposition layer can easily achieve both of metal luster and formability.

Returning to the description of the entire vapor deposition film, in the vapor deposition film according to this embodiment, an adhesive layer may be provided between the protection layer and the decoration layer and between the vapor deposition layer and the decoration layer to enhance the adhesion of those layers. However, in the vapor deposition film according to this embodiment, even when the protection layer, the decoration layer, and the vapor deposition layer are directly laminated in the stated order without such adhesive layer, those layers have excellent adhesion. Therefore, the vapor deposition film does not require an additional layer (for example, anchor layer) for improving close contact between the protection layer and the vapor deposition layer. That is, the vapor deposition film has the decoration layer serving also as the anchor layer. Moreover, the vapor deposition film has less number of interfaces of layers. Therefore, the vapor deposition film is excellent in color tone.

When the adhesive layer is provided, the adhesive layer is not particularly limited. The adhesive layer is made of a resin, and examples of the resin include acrylic resins, urethane resins, urethane-modified polyester resins, polyester resins, epoxy resins, ethylene-vinyl acetate copolymer resins (EVA), vinyl resins (vinyl chloride, vinyl acetate or vinyl chloride-vinylacetate copolymer resin), styrene-ethylene-butylene copolymer resins, polyvinyl alcohol resins, polyacrylamide resins, isobutylene rubber, isoprene rubber, natural rubber, SBR, NBR, and silicone rubber. Those resins may be used in a state of being dissolved in a solvent or in a solventless state, as appropriate.

A thickness of the adhesive layer is not particularly limited. For example, the thickness of the adhesive layer is from about 0.5 μm to about 5 μm.

As compared to the case of performing the black plating, the vapor deposition film according to this embodiment is capable of easily expressing the jet black metallic design having a luxurious appearance on items of various dimensions. Moreover, unlike the related-art vapor deposition film, the vapor deposition film is capable of sufficiently expressing the jet black metallic design without compensation of a color tone with another colorant. Therefore, the degradation in physical properties such as weather resistance due to addition of another colorant is less liable to occur.

Therefore, the vapor deposition film is capable of expressing the jet black metallic design having a luxurious appearance on products of various dimensions, processing the products into black metallic products (For example, various vehicle interior/exterior members, various containers, various casings, etc.), and giving physical properties such as light resistance.

In particular, the vapor deposition film according to this embodiment is suitably used for various vehicle interior/exterior members for which a jet black metallic outer appearance having a luxurious appearance is desired.

Moreover, the vapor deposition film according to this embodiment is suitably used for various containers, such as containers for cosmetics and containers for beverage, for which a jet black metallic outer appearance having a luxurious appearance is desired.

Further, the vapor deposition film according to this embodiment is suitably used for various casings, such as casings for communication devices like mobile phones and home electric appliances, for which a jet black metallic outer appearance having a luxurious appearance is desired.

<Manufacturing Methods for Vapor Deposition Film and Molded Article>

A manufacturing method for the vapor deposition film described above is not particularly limited. For example, the manufacturing method for the vapor deposition film mainly includes a step of preparing the protection layer described above, a step of forming the decoration layer on the protection layer (decoration layer forming step), and a step of forming the vapor deposition layer on the decoration layer (vapor deposition layer forming step). The vapor deposition layer may have an adhesion layer or a backing sheet further formed thereon as needed. The vapor deposition film is molded to be processed into a molded article.

Decoration Layer Forming Step

First, the decoration layer is formed on the prepared protection layer. A forming method for the decoration layer is not particularly limited. For example, the decoration layer may be formed on one surface of the protection layer by any of various printing methods such as gravure printing, screen printing, or inkjet printing. Moreover, the decoration layer may be formed through transfer of decoration by a transfer method.

Vapor Deposition Layer Forming Step

Next, the vapor deposition layer is formed on the decoration layer (vapor deposition layer forming step). A forming method for the vapor deposition layer is not particularly limited. For example, as a vapor deposition method, there may be suitably adopted any of related-art well-known methods including: physical vapor deposition methods such as a vacuum vapor deposition method, a sputtering method, and an ion plating method; and a chemical vapor deposition method. Among those, in view of high productivity, it is preferred that the vapor deposition layer be provided by the vacuum vapor deposition method. As vapor deposition conditions, there may be suitably adopted related-art well-known conditions based on a material of the vapor deposition layer and a desired thickness of the vapor deposition layer. It is preferred that the metal material have less impurities with a purity of 99 weight % or more, more preferably 99.5 weight % or more. Moreover, it is preferred that the metal material be formed into a particle shape, a rod shape, a tablet shape, a wire shape, or a shape of a crucible to be used. As a heating method for evaporating the metal material, there may be used any of well-known methods such as a method of placing the metal material in the crucible and performing resistance heating or high-frequency heating, a method of performing electron beam heating, or a method of placing the metal material on a board made of ceramic such as boron nitride and performing direct resistance heating. It is desired that the crucible to be used for the vacuum vapor deposition be made of carbon, and the crucible may be made of alumina, magnesia, titania, or beryllia.

The obtained vapor deposition film may have an adhesion layer or a hot-melt layer formed on the vapor deposition layer. Those layers are provided for the purpose of applying the vapor deposition film according to this embodiment to a molded product. The adhesion layer or the hot-melt layer is not particularly limited. For example, the adhesion layer is formed of any of various adhesives, tackiness agents, or pressure sensitive adhesives (PSA). Moreover, the hot-melt layer is made of, for example, a urethane-based resin, a polyamide-based resin, an olefin-based resin, or a polyester-based resin.

The vapor deposition film having the adhesion layer may have the backing sheet. The backing sheet is not particularly limited. For example, it is only required that the backing sheet be a thermally moldable polymer sheet, and it is preferred that the backing sheet be, for example, an ABS sheet, a polyacrylic sheet, a polypropylene sheet, a polyethylene sheet, a polycarbonate-based sheet, an A-PET sheet, a PET-G sheet, a vinyl chloride-based sheet, or a polyamide-based sheet.

A thickness of the backing sheet is not particularly limited. For example, it is preferred that the thickness of the backing sheet, in viewpoints of moldability in compression molding, be from 0.05 mm to 5 mm, more preferably from 0.3 mm to 3 mm.

The vapor deposition film having the adhesion layer described above is molded by any of various molding methods, and the molded article is produced. The molding method may be suitably selected based on a configuration of the vapor deposition film. For example, the vapor deposition film having the adhesion layer added thereto is molded by, for example, adhesive vacuum molding or three dimension overlay method (TOM) molding. In the TOM molding, the vapor deposition film is added to a molded article prepared in advance and is softened by heat, thereby being integrally molded so as to be in conformity with the molded article. Meanwhile, in the adhesive vacuum molding, the vapor deposition film is heated by a heater to be softened. Next, the vapor deposition film having been heated is pressed against a mold having a desired three-dimensional shape while being subjected to vacuum suction, and is deformed so as to be in conformity with a shape of a three-dimensional molded article.

Moreover, the vapor deposition film having the hot-melt layer is molded by, for example, the TOM molding or in-line lamination. The vapor deposition film having the backing sheet is molded by, for example, insert injection molding.

The vapor deposition film according to this embodiment and various molded articles are produced through the steps described above. The obtained molded article is suitable for various products (for example, the container, the casing, and the vehicle interior/exterior member described above).

EXAMPLE

Now, the present invention is specifically described with reference to Examples. The present invention is not limited to those Examples at all. Unless otherwise particularly restricted, "%" corresponds to "mass %", and "part" corresponds to "part by mass".

Materials which were used are described below.

<Carbon Black Dispersion Liquid>

Carbon black dispersion liquid 1: dispersion liquid obtained by dispersing carbon black (average particle diameter of 200 nm) of 5 mass %, an acrylic resin of 90 mass %, and a vinyl chloride acetate resin of 5 mass % in a solvent of methyl ethyl ketone (MEK), toluene, and ethyl acetate.

Carbon black dispersion liquid 2: dispersion liquid obtained by dispersing carbon black (average particle diameter of 50 nm) of 5 mass %, acrylic resin of 90 mass %, and a vinyl chloride acetate resin of 5 mass % in a solvent of methyl ethyl ketone (MEK), toluene, and ethyl acetate.

Carbon black dispersion liquid 3: dispersion liquid obtained by dispersing carbon black (average particle diameter of 500 nm) of 5 mass %, an acrylic resin of 90 mass %, and a vinyl chloride acetate resin of 5 mass % in a solvent of methyl ethyl ketone (MEK), toluene, and ethyl acetate.

<Manganese Ferrite Black Spinel Dispersion Liquid>

Manganese ferrite black spinel dispersion liquid 1: dispersion liquid obtained by dispersing manganese ferrite having a spinel structure (average particle diameter of 200 nm) of 15 mass %, an acrylic resin of 78 mass %, and a vinyl chloride acetate resin of 7 mass % in a solvent of methyl ethyl ketone (MEK), toluene, and ethyl acetate.

Manganese ferrite black spinel dispersion liquid 2: dispersion liquid obtained by dispersing manganese ferrite having a spinel structure (average particle diameter of 50 nm) of 15 mass %, an acrylic resin of 78 mass %, and a vinyl chloride acetate resin of 7 mass % in a solvent of methyl ethyl ketone (MEK), toluene, and ethyl acetate.

Manganese ferrite black spinel dispersion liquid 3: dispersion liquid obtained by dispersing manganese ferrite having a spinel structure (average particle diameter of 500 nm) of 15 mass %, an acrylic resin of 78 mass %, and a vinyl chloride acetate resin of 7 mass % in a solvent of methyl ethyl ketone (MEK), toluene, and ethyl acetate.

<Other Black Pigment or the Like>

Other black pigment: dispersion liquid obtained by dispersing copper phthalocyanine (average particle diameter of 200 nm) of 2.5 mass %, carbon black (average particle diameter of 200 nm) of 2.5 mass %, an acrylic resin of 90 mass %, and a vinyl chloride acetate resin of 5 mass % in a solvent of methyl ethyl ketone (MEK), toluene, and ethyl acetate.

Other black dye: dispersion liquid obtained by dispersing metal complex dye (solvent black 29) of 10 mass % and an acrylic resin of 90 mass % in a solvent of methyl ethyl ketone (MEK) and toluene.

Example 1

First, a protection layer (thickness of 75 μm) made of PMMA was prepared. The protection layer was coated through use of a bar coater so that the coating has a thickness of 1.5 μm after drying, and the resultant was dried at 100° C. for 1 minute, thereby forming the decoration layer. Next, a vapor deposition layer was formed on the decoration layer by the vacuum deposition method so that the vapor deposition layer of indium has a thickness of 500 Å to form the vapor deposition layer, thereby producing the vapor deposition film of Example 1. In Example 1, a content of the carbon black among components forming the decoration layer in terms of a solid content was set to 3.5 mass %, and a content of the manganese ferrite among components forming the decoration layer in terms of a solid content was set to 3.5 mass %.

TABLE 1

| | Example | | | | | | | | | |
|---|---|---|---|---|---|---|---|---|---|---|
| | 1 | 2 | 3 | 4 | 5 | 6 | 7 | 8 | 9 | 10 |
| Carbon black dispersion liquid 1 | 3.50 | 2.80 | 1.40 | 0.30 | 2.50 | 2.00 | 1.50 | 0.50 | 7.50 | 4.50 |
| Carbon black dispersion liquid 2 | — | — | — | — | — | — | — | — | — | — |
| Carbon black dispersion liquid 3 | — | — | — | — | — | — | — | — | — | — |
| Manganese ferrite black spinel dispersion liquid 1 | 3.50 | 4.20 | 5.60 | 6.70 | 2.00 | 2.50 | 3.00 | 4.00 | 7.50 | 10.50 |
| Manganese ferrite black spinel dispersion liquid 2 | — | — | — | — | — | — | — | — | — | — |
| Manganese ferrite black spinel dispersion liquid 3 | — | — | — | — | — | — | — | — | — | — |
| Other black pigment | — | — | — | — | — | — | — | — | — | — |
| Other black dye | — | — | — | — | — | — | — | — | — | — |

TABLE 1-continued

| | | | | | | | | | | |
|---|---|---|---|---|---|---|---|---|---|---|
| Sensory test evaluation rank | 4 | 5 | 5 | 5 | 3 | 3 | 3 | 5 | 4 | 3 |
| Light resistance | ○ | ○ | ○ | ○ | ○ | ○ | ○ | ○ | ○ | ○ |

| | Example | | | | | | | | | |
|---|---|---|---|---|---|---|---|---|---|---|
| | 11 | 12 | 13 | 14 | 15 | 16 | 17 | 18 | 19 | 20 |
| Carbon black dispersion liquid 1 | 3.00 | 1.50 | — | — | — | — | — | — | — | — |
| Carbon black dispersion liquid 2 | — | — | 3.50 | 2.10 | 1.40 | 0.30 | — | — | — | — |
| Carbon black dispersion liquid 3 | — | — | — | — | — | — | 3.50 | 2.10 | 1.40 | 0.30 |
| Manganese ferrite black spinel dispersion liquid 1 | 12.00 | 13.50 | — | — | — | — | — | — | — | — |
| Manganese ferrite black spinel dispersion liquid 2 | — | — | 3.50 | 4.90 | 5.60 | 6.70 | — | — | — | — |
| Manganese ferrite black spinel dispersion liquid 3 | — | — | — | — | — | — | 3.50 | 4.90 | 5.60 | 6.70 |
| Other black pigment | — | — | — | — | — | — | — | — | — | — |
| Other black dye | — | — | — | — | — | — | — | — | — | — |
| Sensory test evaluation rank | 3 | 3 | 4 | 5 | 5 | 5 | 4 | 5 | 5 | 5 |
| Light resistance | ○ | ○ | ○ | ○ | ○ | ○ | ○ | ○ | ○ | ○ |

| | Comparative example | | | |
|---|---|---|---|---|
| | 1 | 2 | 3 | 4 |
| Carbon black dispersion liquid 1 | 8 | — | — | — |
| Carbon black dispersion liquid 2 | — | — | — | — |
| Carbon black dispersion liquid 3 | — | — | — | — |
| Manganese ferrite black spinel dispersion liquid 1 | — | 7 | — | — |
| Manganese ferrite black spinel dispersion liquid 2 | — | — | — | — |
| Manganese ferrite black spinel dispersion liquid 3 | — | — | — | — |
| Other black pigment | — | — | 8 | — |
| Other black dye | — | — | — | 8 |
| Sensory test evaluation rank | 1 | 2 | 2 | 2 |
| Light resistance | ○ | ○ | Δ | x |

Examples 2 to 20, Comparative Examples 1 to 4

Vapor deposition films were produced by a method similar to that of Example 1 except that a kind of a dispersion liquid forming the decoration layer and amounts of components forming the decoration layer in terms of a solid component were adjusted based on the specification shown in Table 1.

For the vapor deposition films obtained in Examples 1 to 20 and Comparative examples 1 to 4, a sensory test and a light resistance test were conducted by the following methods. Results are shown in Table 1.

<Sensory Test>

Based on the following evaluation criteria in 5 ranks, a sensory test for an outer appearance was conducted.

(Evaluation Criteria)

5: Jet black having a luxurious appearance was obtained.
4: Jet black was obtained.
3: Black was obtained.
2: Blue was obtained.
1: Brown was obtained.

<Light Resistance Test>

Through use of a light resistance tester (Eye Super UV Tester SUV-W161, manufactured by IWASAKI ELECTRIC CO., LTD.), under environmental conditions of 60° C.×50% RH×100 mW and test time of 200 h, the vapor deposition film was processed, and weather resistance was evaluated based on the following criteria.

○: No change was found on the vapor deposition film after the test.
Δ: Fading was found in the vapor deposition film.
x: The vapor deposition film lost color.

As shown in Table 1, the vapor deposition films of Examples 1 to 20 were excellent in weather resistance. Meanwhile, the vapor deposition film of Comparative example 1 having the decoration layer without the manganese ferrite was brown in outer appearance. The vapor deposition film of Comparative example 2 having the decoration layer without carbon black was blue in outer appearance. The vapor deposition film of Comparative example 3 using other black pigment in place of the manganese ferrite had fading in the light resistance test. The vapor deposition film of Comparative example 4 using the black dye in place of the manganese ferrite and carbon black was blue in outer appearance, and lost color in the light resistance test.

What is claimed is:

1. A vapor deposition film, comprising:
a protection layer;
a decoration layer; and
a vapor deposition layer,
wherein the vapor deposition layer includes a metal including at least one of indium and tin,
wherein the decoration layer includes a resin and a black pigment, and
wherein the black pigment includes carbon black and manganese ferrite having a spinel structure (Fe,Mn)(Fe,Mn)$_2$O$_4$,
wherein a content of the carbon black among components forming the decoration layer in terms of a solid content is 0.3 mass % to 8.0 mass %, and
wherein a content of the manganese ferrite having the spinel structure (Fe,Mn)(Fe,Mn)$_2$O$_4$ among components forming the decoration layer in terms of a solid content is 2.0 mass % to 15.0 mass %.

2. The vapor deposition film according to claim 1, wherein the protection layer is provided as the uppermost layer in the vapor deposition film, followed by the decoration layer beneath the protection layer, and the vapor deposition layer beneath the decoration layer.

3. The vapor deposition film according to claim 1, wherein the content of the manganese ferrite among components forming the decoration layer in terms of the solid content is from 3.5 mass % to 7.5 mass %.

4. The vapor deposition film according to claim 1, wherein the content of the carbon black among components forming the decoration layer in terms of the solid content is from 0.3 mass % to 7.5 mass %.

5. The vapor deposition film according to claim 4, wherein the content of the manganese ferrite among components forming the decoration layer in terms of the solid content is from 4.0 mass % to 7.0 mass %.

6. The vapor deposition film according to claim 1, wherein an average particle diameter of the manganese ferrite is from 100 nm to 500 nm, and an average particle diameter of the carbon black is from 100 nm to 500 nm.

7. A black metallic product comprising the vapor deposition film of claim 1.

8. A vapor deposition film, comprising:
a protection layer;
a decoration layer containing a resin and a black pigment; and
a vapor deposition layer containing a metal including at least one of indium and tin,
wherein the black pigment includes carbon black and manganese ferrite having a spinel structure (Fe,Mn)(Fe,Mn)$_2$O$_4$,
wherein the decoration layer includes solids content containing 0.5 mass % to 8.0 mass % carbon black or 2.0 mass % to 15 mass % manganese ferrite having the spinel structure (Fe,Mn)(Fe,Mn)$_2$O$_4$.

9. The vapor deposition film according to claim 8, wherein the decoration layer is laminated to the vapor deposition layer and the protection layer is laminated to the decoration layer.

10. The vapor deposition film according to claim 8, wherein the decoration layer includes solids content containing 3.5 mass % to 7.5 mass % manganese ferrite having the spinel structure (Fe,Mn)(Fe,Mn)$_2$O$_4$.

11. The vapor deposition film according to claim 8, wherein the decoration layer includes solids content containing 0.5 mass % to 7.5 mass % carbon black.

12. The vapor deposition film according to claim 8, wherein the decoration layer includes solids content containing 4.0 mass % to 7.0 mass % manganese ferrite having the spinel structure (Fe,Mn)(Fe,Mn)$_2$O$_4$.

13. The vapor deposition film according to claim 8, wherein an average particle diameter of the manganese ferrite having the spinel structure (Fe,Mn)(Fe,Mn)$_2$O$_4$ is from 100 nm to 500 nm, and an average particle diameter of the carbon black is from 100 nm to 500 nm.

14. A black metallic product comprising the vapor deposition film of claim 8.

* * * * *